United States Patent [19]

Radun

[11] Patent Number: 5,015,945

[45] Date of Patent: May 14, 1991

[54] CURRENT SENSOR FOR MEASURING CURRENT IN A SEMICONDUCTOR SWITCH

[75] Inventor: Arthur V. Radun, Ballston Lake, N.Y.

[73] Assignee: General Electric Company, Schenectady, N.Y.

[21] Appl. No.: 542,617

[22] Filed: Jun. 25, 1990

[51] Int. Cl.$^5$ .................. G01R 27/02; G01R 31/02
[52] U.S. Cl. .................................. 324/127; 324/126; 324/117 R
[58] Field of Search ................ 324/126, 127, 117 R, 324/117 H, 111, 99 D, 115, 103 P, 142, 244, 258, 260; 340/657; 357/23.4

[56] References Cited

U.S. PATENT DOCUMENTS

| | | | |
|---|---|---|---|
| 4,023,100 | 5/1977 | Smutny | 324/117 R |
| 4,160,922 | 7/1979 | Rickenbacker | 324/111 |
| 4,783,690 | 11/1988 | Walden et al. | 357/23.4 |
| 4,794,327 | 12/1988 | Fernandes | 324/126 |
| 4,896,089 | 1/1990 | Kliman et al. | 318/701 |

*Primary Examiner*—Kenneth Wieder
*Assistant Examiner*—Vinh P. Nguyen
*Attorney, Agent, or Firm*—Jill M. Breedlove; James C. Davis, Jr.; Marvin Snyder

[57] ABSTRACT

A current sensor for measuring relatively high currents in a semiconductor power switching device includes a coil wound around a nonmagnetic toroidal core situated about the conductor through which the current to be measured is flowing. The voltage between the open terminals of the coil winding is proportional to the time derivative of the current flowing in the conductor passing through the toroid. This voltage is provided to an integrator which supplies the corresponding current at its output. A control circuit resets the integrator once per cycle when the current in the switching device is zero. For a bidirectional switching device, a pulse width control circuit ensures that the integrator is reset for a fixed time before the current therein reverses direction. Any accumulation of errors, due to DC and relatively low-frequency components of current, is avoided and current measurements are reliable.

5 Claims, 2 Drawing Sheets

ல,015,945

CURRENT SENSOR FOR MEASURING CURRENT IN A SEMICONDUCTOR SWITCH

FIELD OF THE INVENTION

The present invention relates generally to current sensors. More particularly, the present invention relates to a current sensor for measuring current in a semiconductor switch, which sensor is particularly suitable for highcurrent, high-frequency applications.

BACKGROUND OF THE INVENTION

In power electronic circuits employing semiconductor switches, it is generally necessary to measure currents flowing through the switches for purposes of control and protection. For low current applications, semiconductor switches which incorporate pilot current sensors are available. An exemplary semiconductor switch with an integrated pilot current sensor is described in Walden et al. U.S. Pat. No. 4,783,690, issued Nov. 8, 1988 and assigned to the instant assignee, which patent is hereby incorporated by reference. However, because such integrated semiconductor devices are not capable of handling high currents, bulky and heavy current sensing transformers or Hall effect current sensors are employed in many high current applications. On the other hand, in utility power generation systems, Rogowski coils are often used for current sensing. A Rogowski coil comprises a coil wound around a nonmagnetic toroidal core. The voltage between the open terminals of the Rogowski coil winding is proportional to the time derivative of current flowing in a conductor passing through the toroid. Hence, the current value is obtained by integrating the measured voltage. Such a current measurement is reliable when the following conditions are satisfied: (1) the current has no DC component; (2) the current is relatively large; and (3) all frequency components of the current are above a threshold value. Unfortunately, since currents in power electronic systems generally have a DC component and often have frequency components in a broad range starting from DC, Rogowski coils have not heretofore been employed therein. The primary reason is that a DC signal supplied to the integrator, which is used to derive the current from the voltage measurement, would generate a ramp signal output, thus resulting in an accumulation of errors and unreliable current measurements.

OBJECTS OF THE INVENTION

Accordingly, an object of the present invention is to provide a new and improved current sensor particularly suitable for use in high-current, high-frequency power electronic circuits.

Another object of the present invention is to provide a current sensor for use in high-current, high-frequency power electronic circuits which is small in size and weight and is simple in construction.

Still another object of the present invention is to provide a current sensor for providing accurate and reliable current measurements in high-current, high-frequency power electronic circuits.

SUMMARY OF THE INVENTION

The foregoing and other objects of the present invention are achieved in a current sensor useful for measuring relatively high currents in a power semiconductor switching device. A Rogowski coil, comprising a coil wound around a nonmagnetic toroidal core, is situated about the conductor through which the current to be measured is flowing. The voltage between the open terminals of the Rogowski coil winding is proportional to the time derivative of the current flowing in the conductor passing through the toroid. This voltage is provided to an integrator which supplies the current value at its output. A control circuit resets the integrator once per cycle when the current in the switching device is zero. In this way, any accumulation of errors, which are due to DC and relatively low-frequency components of current, is avoided and current measurements are reliable.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
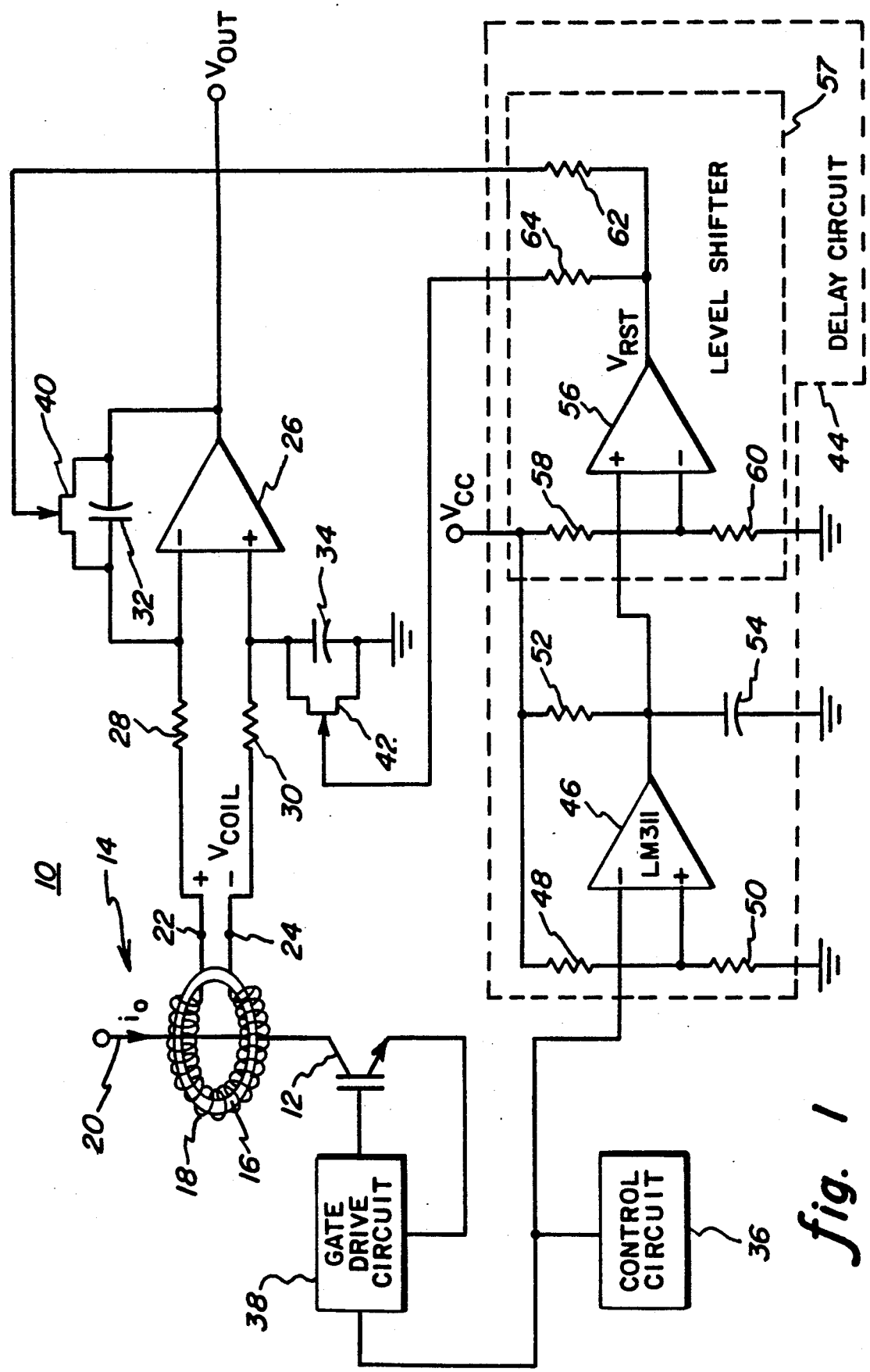
FIG. 1 is a schematic diagram of a current sensor in accordance with a preferred embodiment of the present invention.

FIG. 1 illustrates a current sensor 10 for measuring a current $i_0$ in a semiconductor switching device 12 in accordance with a preferred embodiment of the present invention. Switching device 12 is shown as an insulated gate bipolar transistor (IGBT), but current sensor 10 is suitable for measuring current in other well-known types of semiconductor switching devices, such as bipolar junction transistors (BJT's), metal oxide semiconductor field effect transistors (MOSFET's), or MOS-controlled thyristor (MCT's), inter alia. A Rogowski coil 14, which comprises a nonmagnetic, substantially toroidal core 16 with a coil winding 18 wound thereon, is situated so that a conductor 20 connected to the collector terminal of switching device 12 passes through the center of the core. Terminals 22 and 24 of coil winding 18 are coupled to the inverting and noninverting inputs of an operational amplifier integrator 26 via resistors 28 and 30, respectively. In particular, as shown, integrator 26 is preferably a differential-type integrator for greater noise immunity. A suitable op-amp integrator 26 is a type LF411 manufactured by National Semiconductor Corporation. Integrator 26 includes a feedback capacitor 32 coupled between its output and the inverting input. An additional capacitor 34 is coupled between the noninverting input and ground. A semiconductor switching device 40 and 42 is coupled in parallel with each capacitor 32 and 34, respectively. Semiconductor switching devices 40 and 42 are illustrated as junction field effect transistors (JFET's), but other suitable types of semiconductor devices may be used, if desired. A control circuit 36 for providing turn-on and turn-off signals to a gate driver circuit 38 for driving switching device 12 also provides a reset signal, via a delay circuit 44, for resetting integrator 26 when switching device 12 is turned off. Advantageously, the same signal provided by control circuit 36 for turning off switching device 12 may be employed to reset integrator 26.

In operation, with switching device 12 conducting, the voltage $V_{coil}$ across the terminals of the Rogowski coil is proportional to the time derivative of current $i_0$ flowing through conductor 20 according to the following expression:

$$V_{coil} = \frac{NA_t\mu_0}{L} \cdot \frac{di_0}{dt},$$

where N is the number of coil winding turns, $A_t$ is the surface area of one of the coil winding turns, $\mu_0$ is the permeability of free space, and L is the circumference of the toroidal core. The voltage $V_{coil}$ is integrated by integrator 26 to ideally provide an output voltage $V_{out}$ proportional to the current $i_0$. In actuality, an operational amplifier (opamp), such as that employed in integrator 26, characteristically has an offset voltage. Hence, the output voltage from an op-amp comprises the desired integral plus a ramp voltage which results from integrating the offset voltage. However, in accordance with the present invention, errors due to an increasing ramp voltage, which would otherwise eventually grow sufficiently to saturate the opamp, are substantially reduced by resetting integrator 26 whenever the current $i_0$ through switching device 12 is zero. Hence, by resetting the integrator to zero each time switching device 12 is turned off, errors due to the offset voltage are prevented from accumulating.

The output voltage $V_{out}$ from integrator 26 is given by the following expression:

$$V_{out} = \frac{NA_t\mu_0 i_0}{1RC} + \frac{V_{offset} \cdot t_{max}}{RC},$$

where $V_{offset}$ is the offset voltage of integrator 26 and $t_{max}$ is the maximum time for which switching device 12 would ever be on. The error due to the offset voltage $V_{offset}$ is given by the second term of the hereinabove expression for voltage $V_{out}$, from which term it is apparent that the accuracy of the current sensor increases as switching frequency increases, i.e. as time $t_{max}$ decreases.

Each time control circuit 36 provides a control signal to gate drive circuit 38 for turning off switching device 12, the same signal is provided to JFET's 40 and 42 via delay circuit 44 for resetting integrator 26. Delay circuit 44 is provided to delay the reset signal $V_{RST}$ to the JFET's in order to account for the delay between the time that control circuit 36 provides the gate turn-off signal and the actual turn-off time of switching device 12, i.e. the device fall and storage times. Although many different implementations of delay circuit 44 will occur to those of skill in the art, an exemplary implementation thereof is illustrated in FIG. 1. The inverting input of a first comparator 46, e.g. a type LM311 manufactured by National Semiconductor Corporation, is coupled to control circuit 36 for receiving the turn-off, or reset, signal. The noninverting input of comparator 46 is coupled to a voltage-dividing pair of resistors 48 and 50 for establishing a voltage reference for the comparator. A resistor 52 coupled between a DC supply $V_{cc}$ and the output terminal of comparator 46 acts in combination with a capacitor 54 coupled between the comparator 46 output terminal and ground to establish the delay time for the delay circuit. The voltage across capacitor 54 is applied to the noninverting input of a second comparator 56 of a level-shifting circuit 57. A voltage-dividing pair of resistors 58 and 60 are coupled to the inverting input of comparator 56 for providing its reference voltage. Comparator 56 may likewise comprise a National Semiconductor type LM311. The output of comparator 46 is coupled to JFET's 40 and 42 via resistors 62 and 64, respectively, for providing the reset signal $V_{RST}$ thereto.

In operation, when a turn-off signal is provided by control circuit 36 to gate drive circuit 38, the same signal is supplied to the inverting input of comparator 46. With the input signal to comparator 46 less than the reference voltage thereof, i.e. a low logic level, capacitor 54 continuously charges. However, when the reference voltage of comparator 46 is reached, the capacitor discharges substantially instantaneously through the active output device of the LM311 type comparator 56. Once the capacitor has discharged to the reference level of comparator 56, a high logic level signal is generated to JFET's 40 and 42, hence turning them on. As a result, capacitors 32 and 34 coupled to the respective inputs of integrator 26 are discharged, thus resetting the integrator by pulling the inputs thereto down to zero voltage.

Figure 2:
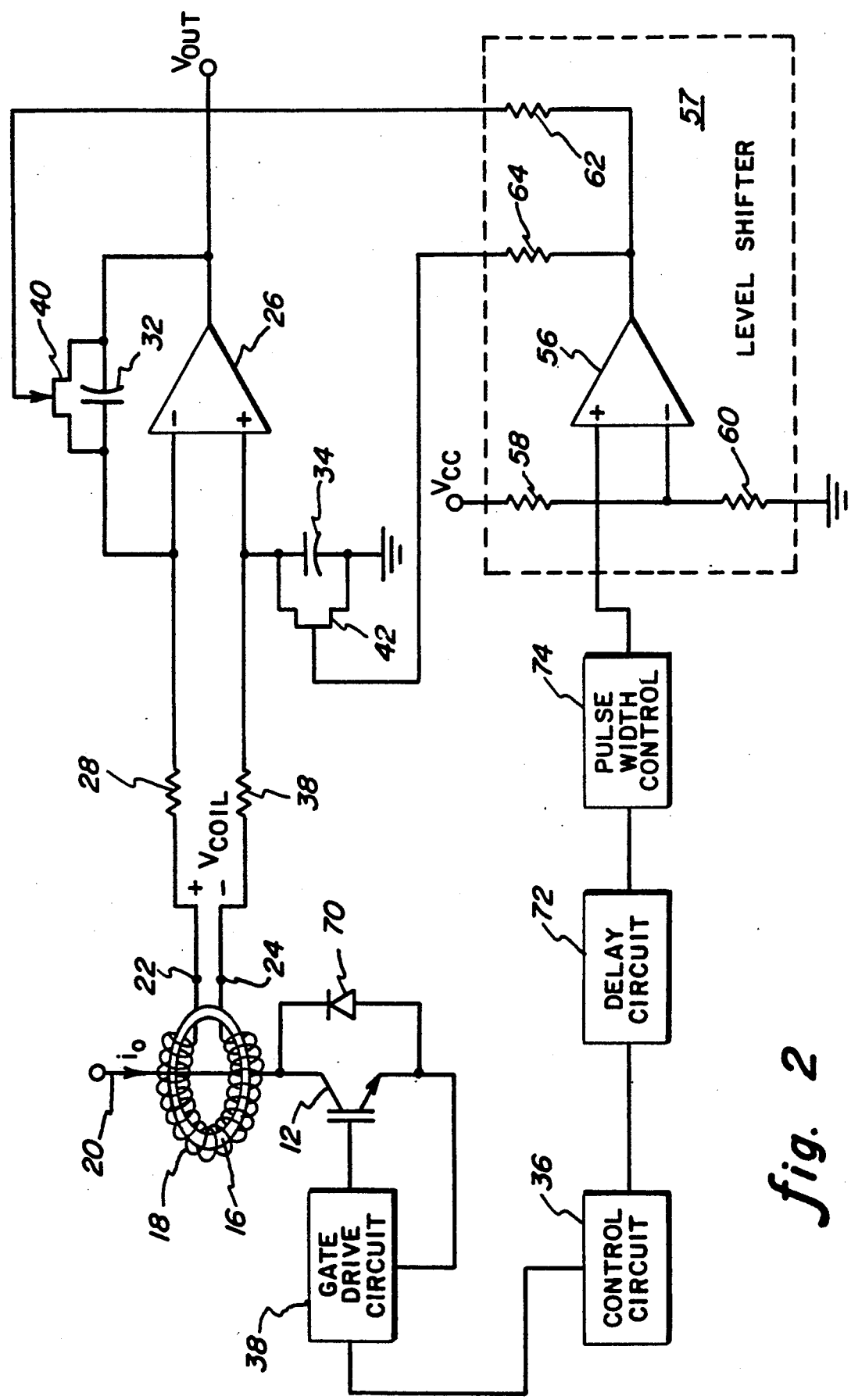
FIG. 2 is a schematic diagram of a current sensor in accordance with an alternative embodiment of the present invention.

FIG. 2 illustrates an alternative embodiment of the present invention useful for applications involving a bidirectional switching device, e.g. a switching device having a diode connected in antiparallel therewith, and a load having a lagging power factor. As shown in FIG. 2, toroid 16 of Rogowski coil 14 is disposed about conductor 20 which is coupled to the junction between the collector terminal of switching device 12 and the cathode of antiparallel diode 70. Control circuit 36 is coupled to a delay circuit 72 for delaying the resetting of integrator 26 to account for the device fall and charge storage times, as described hereinabove in reference to FIG. 1. The output of delay circuit 72 is coupled to a pulse width control circuit 74 for controlling the on-time of JFET's 40 and 42 via level shifter 57. Delay circuit 72 and pulse width control 74 may each comprise a one-shot timer of a type well-known in the art. In a preferred implementation, delay circuit 72 and pulse width control 74 together comprise a dual one-shot timer, e.g. a type MC14528B manufactured by Motorola, Inc.

In operation, the lagging power factor ensures that switching device 12 turns off with current $i_0$ flowing through the device in the forward direction and not in diode 70. Thus, when switching device 12 turns off, the current $i_0$ will be substantially equal to zero for a finite length of time before diode 70 conducts. In accordance with the present invention, integrator 26 is reset during this finite time period. Delay circuit 72 accounts for the time delay between generation of the turn-off signal from control circuit 36 and the time the switching device actually turns off Pulse width control 74 resets integrator 26, via level shifter 57, for a fixed period of time, independent of the control signal from control circuit 36. The pulse width of the voltage $V_{RST}$ whiCh is set by control 74 must be sufficiently large to reset integrator 26 to zero, but small enough to ensure that the integrator is reset before the current $i_0$ reverses direction and flows through diode 70.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A current sensor for sensing a current flowing in a conductor, comprising:
   a current sensing coil wound around a nonmagnetic substantially toroidal core situated so that said conductor passes through the center of said core, said coil having two terminals across which is produced a voltage proportional to the derivative of said current;
   an integrator having an inverting input and a noninverting input respectively coupled to the two terminals of said coil, said integrator providing a voltage proportional to said current at the output thereof; and
   control circuit means for resetting the output voltage of said integrator to zero whenever said current is substantially zero.

2. A current sensor for sensing a current flowing in a unidirectional semiconductor switching device, comprising:
   a current sensing coil wound around a nonmagnetic, substantially toroidal core situated so that a conductor coupled in series with said switching device passes through the center of said core, said coil having two terminals across which is produced a voltage proportional to the derivative of said current;
   an integrator having an inverting input and a noninverting input respectively coupled to the two terminals of said coil, said integrator providing a voltage proportional to said current at the output thereof; and
   control circuit means coupled to said switching device via drive circuit means and further coupled to said integrator for generating a reset signal for resetting the output voltage of said integrator to zero whenever said switching device is turned off.

3. The current sensor of claim 2 wherein said control circuit means comprises delay circuit means for delaying the resetting of said integrator after said switching device is turned off until said current is substantially zero.

4. A current sensor for measuring current in a bidirectional semiconductor switching device, comprising:
   a current sensing coil wound around a nonmagnetic, substantially toroidal core situated so that a conductor coupled in series with said switching device passes through the center of said core, said coil having two terminals across which is produced a voltage proportional to the derivative of said current;
   an integrator having an inverting input and a noninverting input respectively coupled to the two terminals of said coil, said integrator providing a voltage proportional to said current at the output thereof;
   control circuit means coupled to said switching device via drive circuit means and further coupled to said integrator for generating a reset signal for resetting the output of said integrator to zero whenever said current is substantially zero; and
   pulse width control means for receiving said reset signal and providing a fixed pulse width for ensuring that said integrator is reset for a fixed time period before current in said semiconductor switching device reverses direction.

5. The current sensor of claim 4 wherein said control circuit means includes delay circuit means for delaying the resetting of said integrator after said switching device is turned off until said current is substantially zero.

* * * * *